US005961727A

United States Patent [19]

Funabashi et al.

[11] Patent Number: 5,961,727

[45] Date of Patent: Oct. 5, 1999

[54] SEALING APPARATUS FOR VACUUM TREATMENT OF SUPPORT FOR LIGHT-SENSITIVE MATERIAL

[75] Inventors: Shinichi Funabashi; Osamu Nagayama; Takashi Nawano; Hisashi Tsubata; Tadashi Aiba, all of Kanagawa, Japan

[73] Assignee: Fuji Photo Film Co., Ltd., Kanagawa, Japan

[21] Appl. No.: 09/092,083

[22] Filed: Jun. 5, 1998

Related U.S. Application Data

[62] Division of application No. 08/835,636, Apr. 10, 1997, Pat. No. 5,865,932, which is a continuation of application No. 08/386,767, Feb. 10, 1995, abandoned.

[30] Foreign Application Priority Data

Feb. 10, 1994 [JP] Japan .................................... 6-016626

[51] Int. Cl.$^{6}$ ............................ C23C 16/00; B32B 31/00

[52] U.S. Cl. .......................... 118/733; 118/718; 118/719; 156/272.6; 156/382

[58] Field of Search ............................ 118/718–719, 733; 425/363, 385; 430/501, 532, 533; 156/272.6, 382; 351/212, 214, 220

[56] References Cited

U.S. PATENT DOCUMENTS

| | | | |
|---|---|---|---|
| 2,989,026 | 6/1961 | Gardner et al. | 118/718 |
| 3,158,507 | 11/1964 | Alexander et al. | 118/718 |
| 3,369,982 | 2/1968 | Wood | 204/168 |
| 3,729,648 | 4/1973 | Kerr | 361/213 |
| 4,021,179 | 5/1977 | Pira et al. | 425/363 |
| 4,234,300 | 11/1980 | Yamagisi et al. | 425/363 |
| 5,000,114 | 3/1991 | Yanagi et al. | 118/733 |
| 5,016,561 | 5/1991 | Tokai et al. | 118/718 |
| 5,314,539 | 5/1994 | Brown et al. | 118/718 |
| 5,326,689 | 7/1994 | Murayama | 422/907 |
| 5,328,555 | 7/1994 | Gupta | 156/643 |
| 5,693,238 | 12/1997 | Schmitt | 156/345 |

FOREIGN PATENT DOCUMENTS 1210267 3/1960 France .

*Primary Examiner*—Hien Tran
*Attorney, Agent, or Firm*—Sughrue, Mion, Zinn, Macpeak & Seas, PLLC

[57] ABSTRACT

In a method in which a thin-film support is continuously led into a vacuum chamber from the atmospheric air, subjected to surface treatment and led-out to the atmospheric air again, a pneumatical cutoff portion of a leading-in and leading-out section is constituted by seal roller sets each of which is formed by aligned pairs of leading-in rollers and leading-out rollers which are close to each other through slight distances, and the support is led-in and led-out while lapped at an angle of from 30 to 150 degrees around the pair of rollers nearest to the atmospheric air of the seal roller sets.

12 Claims, 4 Drawing Sheets

SEALING APPARATUS FOR VACUUM TREATMENT OF SUPPORT FOR LIGHT-SENSITIVE MATERIAL

This is a divisional of application Ser. No. 08/835,636 filed Apr. 10, 1997, now U.S. Pat. No. 5,865,932, which is a continuation of Ser. No. 08/386,767, filed Feb. 10, 1995, now abandoned.

BACKGROUND OF THE INVENTION

The present invention relates to a sealing method and an apparatus therefor, for pneumatically cutting off a vacuum chamber from atmospheric air at the time of execution of vacuum treatment such as glow discharge treatment, etc. and more specifically relates to a sealing method and a sealing apparatus in the case where a support for light-sensitive material is continuously subjected to glow discharge treatment.

Heretofore, various surface treatments, such as vacuum glow discharge treatment, low-temperature plasma treatment such as electrodeless plasma discharge treatment, etc., corona discharge treatment, ultraviolet-ray radiation treatment, and so on, have been carried out onto a plastic film, a metal plate, or the like, for the purpose of improving adhesive force between such a plastic film, a metal plate or the like and a resin or metal layer provided on the surface of the former. It is known that vacuum glow discharge treatment is carried out particularly on a polymer film for the purpose of improvement of the adhesive property, hydrophilic property, dye-affinity, and so on.

The vacuum glow discharge treatment is described, for example, in U.S. Pat. Nos. 3,462,335, 3,761,299, 4,072,769, and so on. Particularly, examples in which glow discharge treatment is preferably used for a support of photographic light-sensitive material without spoiling the flatness and surface characteristic are disclosed in Japanese Patent Unexamined Publication No. Sho-59-56430, Japanese Patent Post-Examination Publication Nos. Sho-60-16614 and Hei-3-39106, etc. and are proposed in Japanese Patent Application Nos. Hei-5-147864, Hei-5-199704, etc. filed by the applicant of the present application.

In the case where a thin-film web is to be subjected to vacuum treatment continuously, the web is led into a vacuum chamber from atmospheric air and back out to atmospheric air after treatment. Accordingly, means for performing leading-in and leading-out of the support while atmospheric air and the vacuum chamber are being sealed from each other are required. As such means, a sealing apparatus in a vacuum vapor depositing apparatus is proposed, for example, in Japanese Patent Unexamined Publication Nos. Hei-1-272767, Hei-1-259169 and Hei-1-287275, PCT-Domestic Publication No. Hei-5-507383, and so on, and an example of a sealing apparatus in a low-temperature plasma treatment apparatus is disclosed in PCT-Domestic Publication No. Hei-5-507383.

FIG. 5 shows a sealing apparatus in a vacuum vapor depositing apparatus described in Japanese Patent Unexamined Publication No. Hei-1-287275. The sealing apparatus described in Japanese Patent Unexamined Publication No. Hei-1-287275 has a structure in which the portion between atmospheric air to a vacuum chamber is partitioned into a plurality of pressure chambers by seal rollers 100 each of which is constituted by a set of three pinch rollers, and a web W is made to move while lapped at a lap angle not lower than 10° around the seal rollers 100. This apparatus is effective for preventing fluttering of the web W having a thickness of about 20 μm, but in the case where the thickness of the web W is not smaller than 80 μm, the moving condition of the web W however varies in accordance with the stiffness of the web W, or the like, so that the quantity of the atmospheric air in a space between the web W and the rollers 100 also varies. For example, in the case of a web W such as a polyester film for a support of photographic light-sensitive material, conveyance performance by the rollers 100 at a lap angle of about 10 degrees is insufficient to solve the problem of fluttering. If fluttering of the web W occurs as described above, slight scratching occurs in a surface portion of the web W contacting the rollers 100 so that the flatness and surface characteristic of the web are spoiled.

On the other hand, a structure in which a web is conveyed while nipped by rollers is disclosed in PCT-Domestic Publication No. Hei-5-507383, but in this structure, sliding contact between the rollers and the web is not avoidable, so that scratching occurs in the web and accordingly the flatness and surface characteristic of the web are spoiled.

SUMMARY OF THE INVENTION

An object of the present invention is to provide a vacuum treatment sealing method and an apparatus therefore, in which a material mechanically sensitive to failure, particularly such as a support for photographic light-sensitive material, is prevented from fluttering during the conveyance thereof in a vacuum so that occurrence of scratching can be prevented.

The foregoing object of the present invention is achieved by a sealing method for vacuum treatment of a support for light-sensitive material, in which a thin-film web is continuously led into a vacuum chamber from the atmospheric air, subjected to surface treatment and then back out to the atmospheric air, characterized in that a pneumatical cutoff portion of a leading-in and leading-out section is constituted by seal roller sets each of which is formed by aligned pairs of leading-in rollers and leading-out rollers which are close to each other through slight distances, and in that the support is led-in and led-out while lapped at an angle of from 30 to 150 degrees around the pair of rollers of the seal roller set nearest to atmospheric air.

The present invention is particularly effective in the case where a polyethylene naphthalate or polyethylene terephthalate film having a thickness of from 80 to 190 μm is used as the support.

In the present invention, in the case where a knurling treatment is applied to both side edge portions of the support, the support is preferably led-in and led-out while lapped around the seal rollers at a lap angle in a range of from 50 to 120 degrees.

In the present invention, the width of the support is selected preferably to be not smaller than 400 mm, more preferably in a range of from 1000 to 2000 mm.

By leading-in and leading-out the support while lapping the support at a lap angle in a range of from 30 to 150 degrees around the pair of rollers of the seal roller set nearest to atmospheric air, fluttering of the support during the conveyance thereof can be prevented, so that scratching of the support caused by the fluttering can be prevented.

Although an effect of preventing fluttering and scratching can be obtained even in the case where the seal roller pair with a lap angle set in a range of from 30 to 150 degrees is selected to be only the pair of rollers nearest to the atmospheric air, the lap angle around each and every of all the pairs of seal roller may be selected to be in a range of from 30 to 150 degrees.

DETAILED DESCRIPTION OF THE PREFERRED EMBODIMENTS

The structure of the present invention will be explained with reference to FIGS. 1 and 2.

Figure 1:
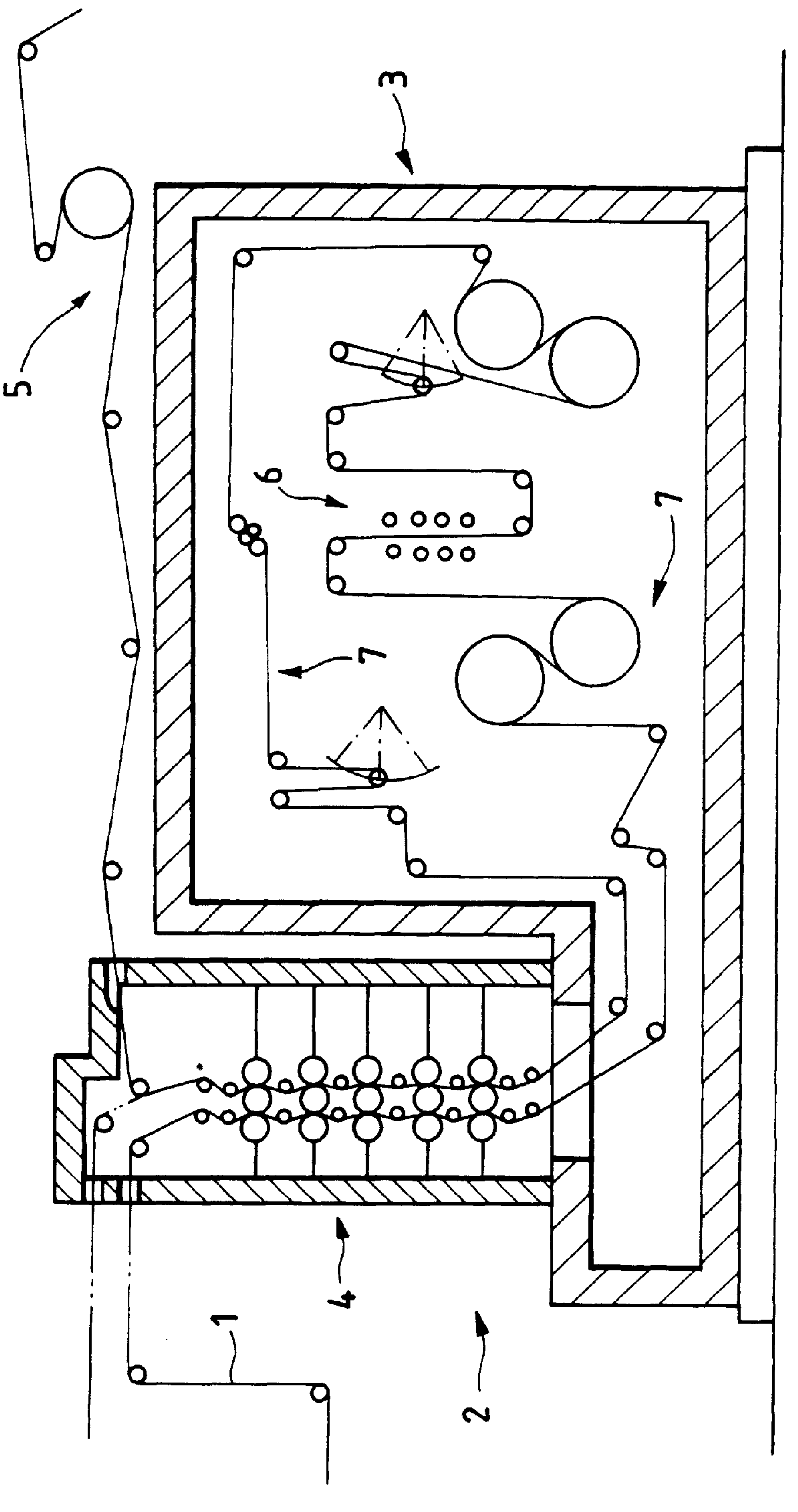
FIG. 1 is an overall structural diagram of a vacuum treatment apparatus used in the present invention.
Figure 2:
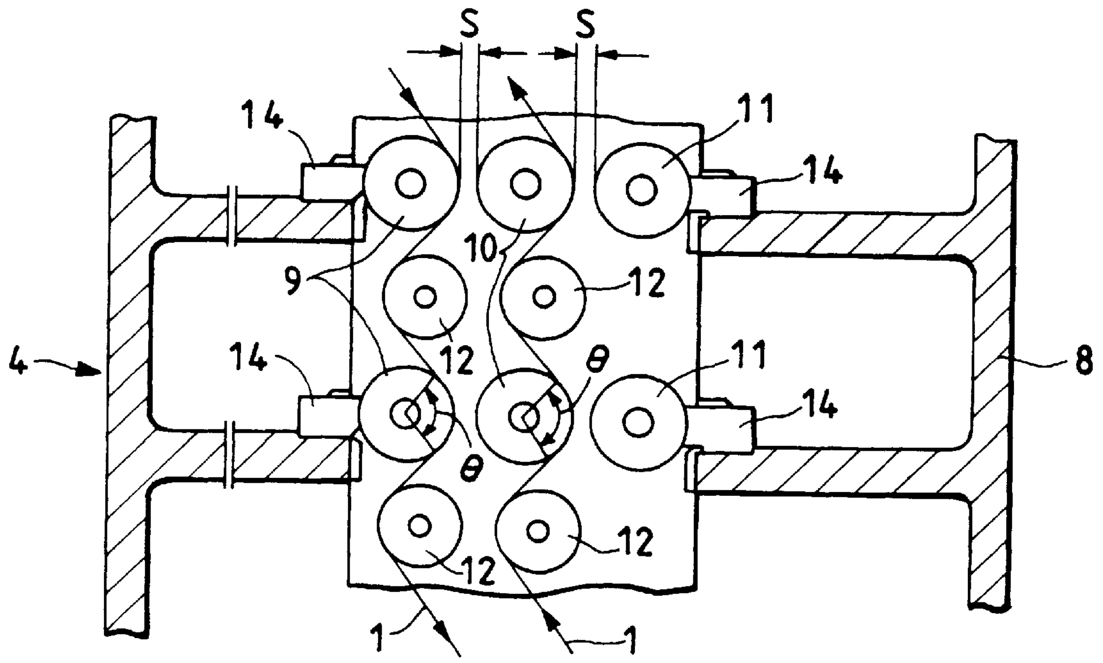
FIG. 2 is an enlarged explanatory diagram of a leading-in and leading-out section in which a support is led into a vacuum chamber from the atmospheric air continuously, subjected to surface treatment in the vacuum chamber and led-out to the atmospheric air again.

FIG. 1 shows an overall conceptual view of a vacuum treatment apparatus used in the present invention, and FIG. 2 shows an explanatory view of a support leading-in and leading-out section in which a support is continuously led to a vacuum chamber from the atmospheric air, subjected to surface treatment in the vacuum chamber and then back out to the atmospheric air.

In FIG. 1, the vacuum treatment apparatus 2 comprises a vacuum treatment chamber 3, a leading-in and leading-out section 4, and an external conveyance system 5. The inside of the vacuum treatment chamber 3 is provided with a surface treatment portion 6 (for example, a glow discharge treatment portion) and an internal conveyance system 7 for guiding the support 1 to the surface treatment portion 6.

The internal conveyance system 7 may be additionally provided with means necessary for conveyance control (control for speed, tension, edge position, etc.), temperature control (control for heating to a surface treatment temperature, cooling after treatment, etc.), charge control (removal of electric charge during conveyance, etc.), and so on, in accordance with the selected condition.

The leading-in and leading-out section 4 for the support 1 shown in FIG. 2 includes a leading-in roller group having a plurality of leading-in rollers 9 aligned in a vertical line in a casing 8, a leading-out roller group having a plurality of leading-out rollers 10 aligned in a vertical line in the casing 8, and an auxiliary seal roller group having auxiliary seal rollers 11 aligned in a vertical line for aiding sealing in respective sections in the casing 8. And, these leading-in roller 9, leading-out roller 10 and auxiliary seal roller 11 form a set of seal rollers. The leading-in and leading-out section 4 further includes auxiliary rollers 12 provided between respective rollers in the leading-in and leading-out roller groups and for giving a predetermined lap angle θ to the leading-in and leading-out roller groups. By adjusting the positions of the auxiliary rollers 12 in the left and right directions in the drawing, the lap angle θ of the support 1 around the leading-in and leading-out roller groups can be adjusted.

The leading-in rollers 9 and the leading-out rollers 10 are arranged so that adjacent rollers aligned in horizontal lines form pairs respectively at an interval of a slight distance S. In FIG. 2, the auxiliary seal rollers 11 and the leading-out rollers 10 are also arranged so as to form pairs respectively at an interval of the same slight distance S as described above. Further as shown in FIG. 2, each leading in roller 9 is spaced from auxiliary rollers 12 by greater than distance S.

In portions of proximity between the casing 8 and the leading-in rollers 9 and in portions of proximity between the casing 8 and the auxiliary seal rollers 11, there are provided seal bars 14 slidably attached to the respective rollers and for intercepting the movement of gas between respective small chambers in the casing 8. The respective small chambers of the casing 8 partitioned by the seal bars 14 are connected individually to decompression means not shown and are formed so that the degree of vacuum is heightened gradually from a portion facing the atmospheric air to the vacuum treatment chamber.

The distance S between the leading-in rollers 9 and the leading-out rollers 10 aligned in horizontal lines respectively as well as the distance between leading-in rollers 9 and auxiliary rollers 12, is selected to be larger by 50 μm or more than the thickness of the support. Although setting the distance to zero as described preliminarily in the prior art, that is, nipping by rollers, is advantageous in that a necessary degree of vacuum is obtained through a short leading-in and leading-out section, the nipping by the rollers cannot be adapted to a support sensitive to scratching, such as a support for photographic light-sensitive material. Further, in the case where supports are joined with one another for continuous treatment, a special operation is required for making joint portions of the supports pass through the nip portion appropriately. Accordingly, the formation of the distance between rollers as in the present invention is very effective for completion of prevention of scratching.

On the other hand, in the method of the present invention, the support is conveyed while successively passing through small chambers which are different stepwise in the degree of vacuum, so that there is the necessity of consideration of preventing the fluttering of the support caused by the air flow at the respective distance as created by pressure difference. In the present invention, by conveying the support with a lap angle θ in a range of from 30 to 150 degrees, preferably from 50 to 120 degrees, taking into account the physical properties, thickness, etc. of the material for the support as a subject, fluttering of the support can be prevented, that is, conveyance can be made without occurrence of scratching.

On the contrary, in the case of a lap angle θ of not more than 30 degrees, the opportunity of occurrence of scratching caused by the fluttering increases and, in the case of a lap angle θ of not less than 150 degrees, the opportunity of occurrence of scratching caused by creaking between the support and the rollers, and the like, increases.

Examples of the support material which can be used as a subject of treatment in the present invention, include: polyester such as polyethylene terephthalate, polyethylene naphthalate, polybutylene terephthalate, poly-1,4-cyclohexanedimethylene terephthalate, polyethylene 1,2-diphenoxyethane-4,4'-dicarboxylate, copolymerization polyester containing aromatic dicarboxylic acid having polyethylene phthalate metallosulfonate as a copolymerization component, copolymerization polyester containing aromatic dicarboxylic acid and aliphatic dicaroxylic acid having metal sulfonate as copolymerization components, etc.; cellulose ester such as cellulose triacetate, cellulose diacetate, cellulose propionate, cellulose acetate propionate, cellulose butylate, cellulose acetate butylate, etc.; polyamide; polycarbonate; polystyrene; polypropylene; polyethylene; polymethylpentene; polysulfone; polyethersulfone; polyallylate; aromatic polyetherimide; polyphenylene sulfide; and so on.

Other examples of the support which can be used in the present invention have been disclosed in Japanese Patent Unexamined Publication Nos. Hei-1-244446, Hei-3-54551, Hei-3-84542, Hei-4-220329, Hei-4-234039, Hei-4-235036, Hei-5-307229 and Hei-5-307230, and European Patent No. 572,275-A1.

The present invention can be applied to any one of the aforementioned supports or any polymer blend thereof, especially preferably applied to a film of polyester such as polyethylene terephthalate, polyethylene naphthalate, etc. In the case where these polyester films are used, the preferred thickness thereof is selected to be in a range of from 80 to 190 μm.

Conditions used for vacuum glow discharge treatment of polymer film, that is, conditions such as the degree of vacuum, discharge treatment intensity, discharge frequency, treatment temperature, atmospheric gas, etc. are selected suitably in accordance with the composition of the support as a subject of the treatment and the purpose of the treatment. For example, pressure is selected to be in a range of from 0.005 to 20 Torr, preferably, from 0.02 to 2 Torr, voltage is selected to be in a range of from 500 to 5000 V, preferably from 2000 to 4000 V, discharge frequency is selected to be in a range of from DC to the order of thousands of MHz, preferably from 50 Hz to 20 MHz, more preferably from 1 KHz to 1 MHz, and discharge treatment intensity is selected to be in a range of from 0.01 to 5 $KV\cdot A\cdot min/m^2$, preferably from 0.15 to 1 $KV\cdot A\cdot min/m^2$.

The temperature for vacuum glow discharge treatment is selected under the consideration of the glass transition point of the support as a subject and, with respect to the aforementioned support materials, the temperature is substantially selected to be in a range of from about 50° C. to about (glass transition point +40)° C. For example, the temperature in a range of from 50 to 100° C. is preferably used for a polyethylene terephthalate film and the temperature in a range of from 50 to 120° C. is preferably used for a polyethylene naphthalate film.

Incidentally, there are some cases where the temperature of the support rises to exceed greatly the glass transition point because of the application of glow discharge treatment but, for example, a method of cooling the support to a temperature of not higher than the glass transition point in a predetermined pattern in accordance with the method described in Japanese Patent Post-Examination Publication No. Hei-3-39106 can be employed after the glow discharge treatment.

That is, there can be employed a method in which the support after the glow discharge treatment is cooled by several cooling rollers successively so that the temperature difference of the cooled support is not higher than 40° C.

Figure 6:
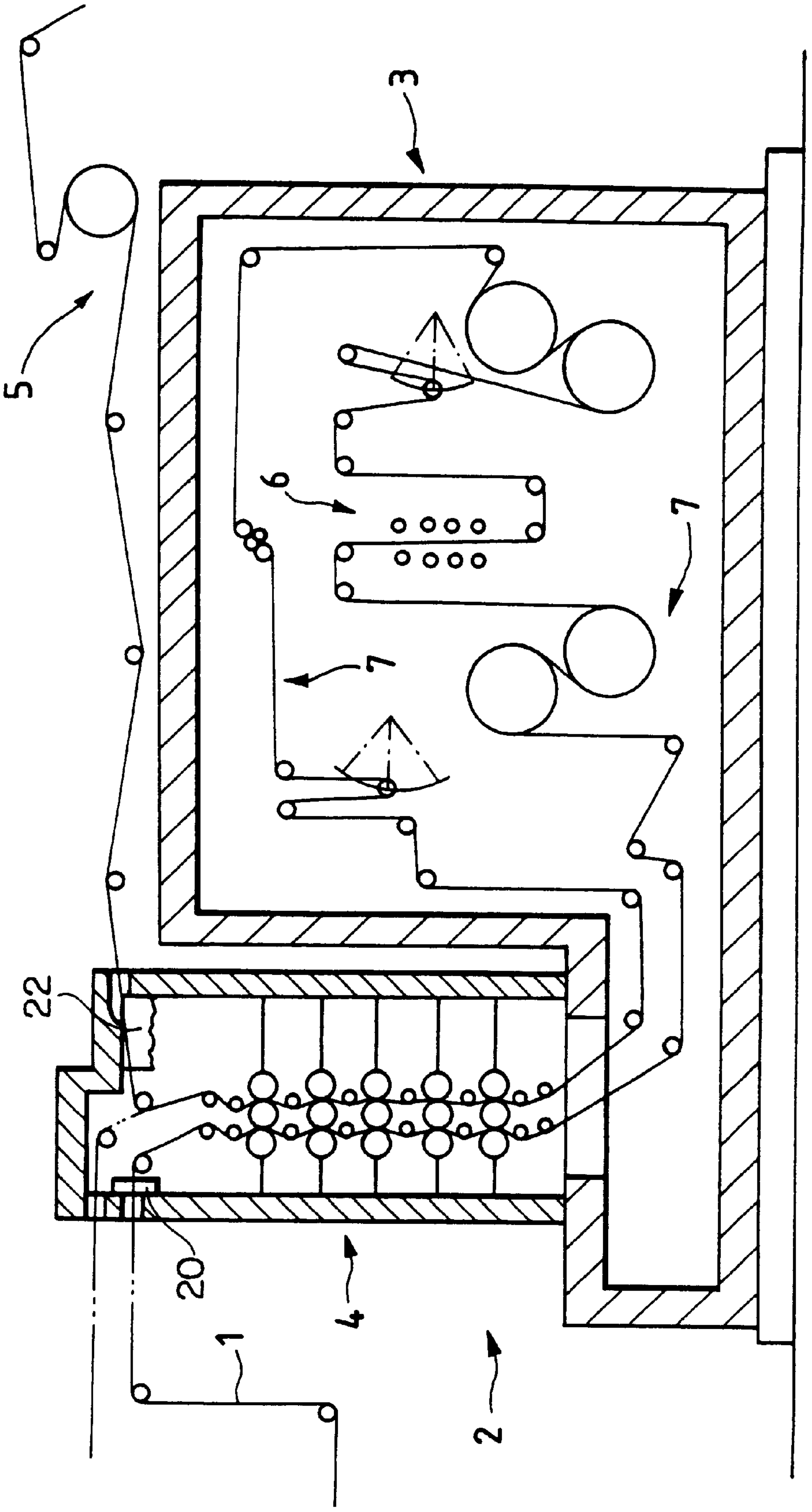
FIG. 6 is an overall structural diagram similar to FIG. 1.

In a vacuum, the support holding force of the rollers is generally strengthened because there is no air layer carried when the support is conveyed by the rollers. Under such conditions, foreign matter carried with the support or coming by flying from the atmosphere may be deposited on the support and ridden on the pass rollers to thereby damage the support. It is therefore important in the present invention that dust-proof/dust-removal means 20 is applied particularly to the portion in which the support is led into a vacuum from the atmospheric air. Dust proof/dust removal means 20 is shown schematically in FIG. 6.

Further, electrostatic charge created by conveyance of the support in a vacuum is hardly escaped because of the absence of media such as water vapor, etc. compared with the inside of the atmospheric air, so that electrostatic charge with high voltage may be led-out to the atmospheric air. If the charge voltage is high, dust is apt to be attracted in conveyance in the atmospheric air and apt to damage the support in the same manner as described above. It is therefore preferable that charge removing means 22 such as electrically conductive bars, etc. are provided in the leading-out portion in the present invention. Charge removing means 22 is shown schematically in FIG. 6.

In order to heighten the conveyance property in the case where the support is conveyed in the atmospheric air or in a vacuum chamber, a knurling treatment is often applied to both side edge portions of the support.

The knurling treatment is a treatment in which both side edge portions of the support are nipped by rollers having roughness so as to be deformed to have rough patterns. For example, embodiments of the knurling treatment are introduced in Japanese Post-Examination Publication No. Sho-57-36129. These embodiments may be employed. For example, the respective rough patterns are shaped like stripes along the lengthwise direction at the side edge portions of the support. The stripe patterns are formed so that one or more stripes may be provided in each side edge portion. The height of the roughness is selected to be preferably in a range of from about 10% to about 60% of the thickness of the support. The width of each of the stripe patterns is selected to be preferably in a range of from 3 to 15 mm, more preferably from 8 to 12 mm. The pitch of the roughness is selected to be preferably in a range of from 0.5 to 5 mm, more preferably from 0.8 to 3 mm.

The thus knurled supports are useful to solve the problems in conveyance, because the intensity of contact between the supports or the intensity of contact between the supports and the pass rollers is reduced at the time of conveyance in a process or at the time of preservation in a wound state as a roll to thereby prevent harmful adhesion so that security of air-permeability in the roll, or the like, can be made. In the case where such a knurled support is applied to the present invention, the optimum range for the lap angle θ in the leading-in and leading-out section is slightly narrowed because apparent stiffness is considered to be heightened. That is, the preferred range is from 50 to 120 degrees.

Embodiments of the present invention will be explained to make the effect of the present invention clear.

EXAMPLE 1

Using a 1500 mm-width polyethylene naphthalate film as a support, the fluttering state of the support was evaluated by eye while the lap angle θ around rollers was changed in the case of the thickness of the support of 20 μm and in the case of the thickness of the support of 80 μm. Each of the distances between the pairs of leading-in and leading-out rollers was selected to be larger by 50 μm than the thickness of the support.

Figure 3:
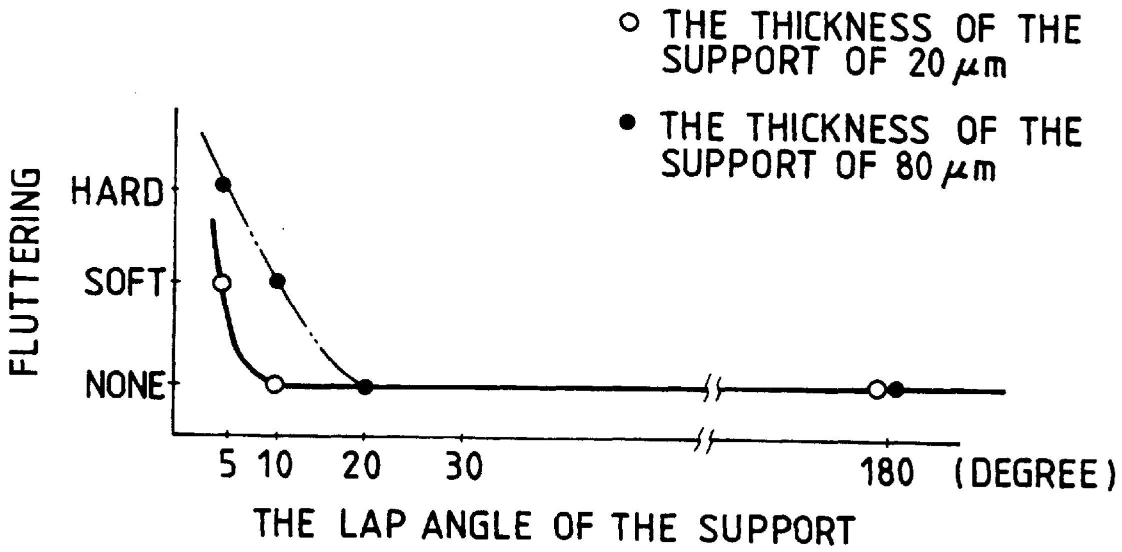
FIG. 3 is a graph showing relations between the lap angle of the support and fluttering.

FIG. 3 shows results of the evaluation in the degree of fluttering. It was apparent from FIG. 3 that in the case of the thickness of the support of 20 μm, fluttering could be confirmed even by eye at a lap angle θ smaller than 10 degrees and that there was no fluttering at a lap angle θ not smaller than 10 degrees. In the case of the thickness of the support of 80 μm, however, fluttering could be confirmed even by eye at a lap angle θ smaller than 20 degrees. It is considered this was caused by the heightening of the stiffness of the support.

In this manner, in the case of the thickness of the support of 80 μm, a fluttering prevention effect appears at the lap angle θ not smaller than 20 degrees, so that it is apparent that a lap angle θ not smaller than 20 degrees is required for prevention of fluttering.

EXAMPLE 2

With respect to the aforementioned range for the lap angle θ, the fluttering state of the support was checked while the thickness of the support was changed. Using supports having thicknesses of 100 μm, 130 μm, 150 μm, 170 μm and 190 μm, the fluttering state depending on the change of the lap angle θ was observed by eye. As a result, there was no fluttering observed at a lap angle θ not smaller than 20 degrees like Example 1.

It is accordingly apparent that the fluttering of the support can be prevented steadily when the lap angle θ around the rollers is not smaller than 20 degrees in the case where the thickness of the support is in a range of from 80 to 190 μm.

EXAMPLE 3

In the 80 μm-thick support in Example 1, the lap angle θ around the rollers and the state of occurrence of scratching were examined in accordance with the presence/absence of the knurling treatment.

As the knurling treatment, 10 μm-height projections (conically shaped or semispherically shaped) were embossed on both side edge portions of the support so as form stripes (10 mm wide) at intervals of 2 mm pitch along the lengthwise direction thereof.

For judgment of occurrence of scratching, a sample having allowable scratching was prepared so that relative comparison between this sample and the aforementioned sample was made by eye to thereby judge whether the aforementioned sample was allowable (OK) or not (NG).

Figure 4:
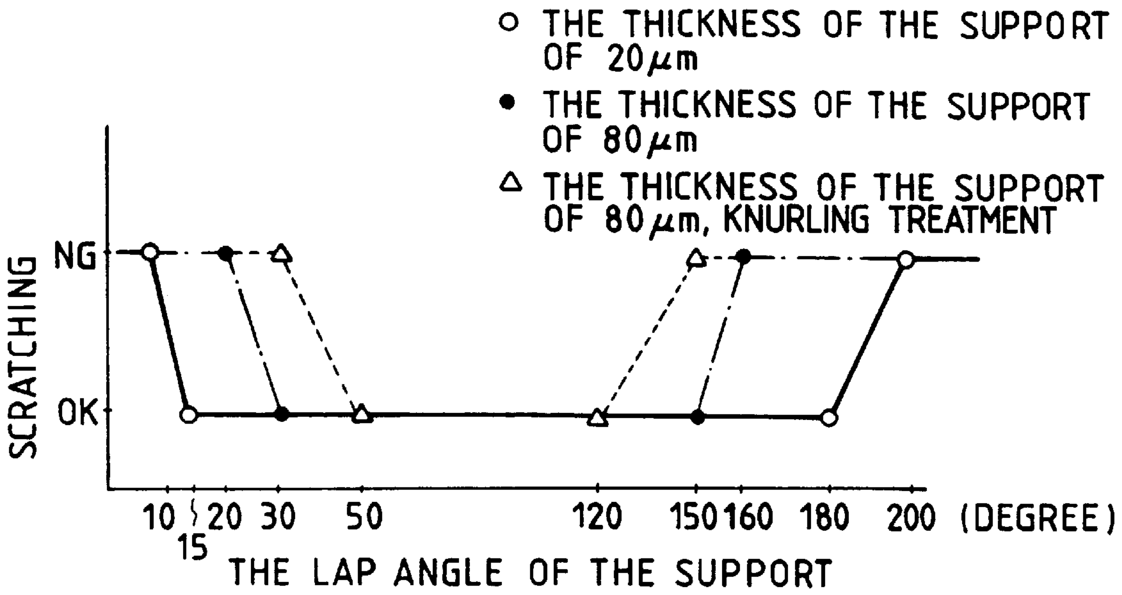
FIG. 4 is a graph showing relations between the presence/absence of a knurling treatment and scratching.
Figure 5:
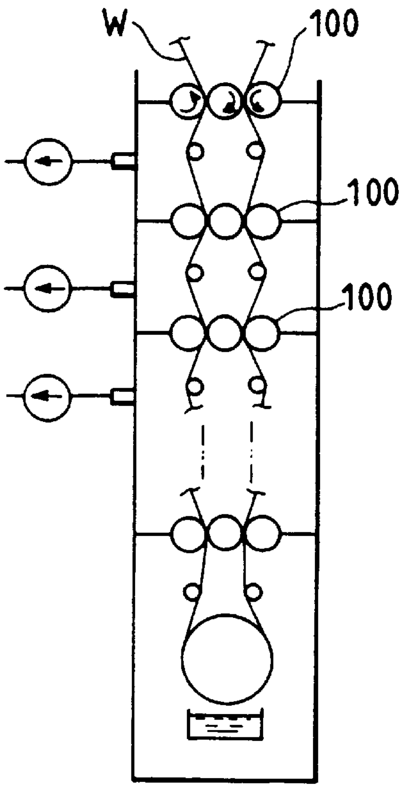
FIG. 5 PRIOR ART
FIG. 5 is a structural diagram of a seal device of a vacuum vapor depositing apparatus showing a conventional technique.

As shown. in FIG. 4, in the aforementioned knurled support, scratching occurred even at a lap angle θ of 20 degrees and there was no scratching at a lap angle θ in a range of from 50 degrees to 120 degrees.

It is apparent from this fact that in the case of an unknurled support, scratching can be prevented at a lap angle θ in a range of from 30 to 150 degrees and, in the case of a knurled support, scratching can be prevented at a lap angle θ in a range of from 50 to 120 degrees to obtain stable results.

Incidentally, in the case of the thickness of the support of 20 μm subjected to the same comparison, good results without scratching were obtained at a lap angle θ in a range of from 15 to 180 degrees. In Contrast to the case of the 20 μm-thick support, prevention of fluttering was observed by eyes even at a lap angle θ of 10 degrees but it was actually apparent that scratching caused by slight fluttering occurred.

According to the method and apparatus of the present invention, distances are provided between the leading-in and leading-out roller groups and the lap angle is selected to be in a range of from 30 to 150 degrees or, in the case of a knurled support, the lap angle is selected to be in a range of from 50 to 120 degrees to thereby make it possible to prevent fluttering and scratching of the support completely, so that leading-in of the support into the vacuum treatment apparatus and leading-out of the support from the vacuum treatment apparatus can be continuously stably performed.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A sealing apparatus for vacuum treatment of a support for light-sensitive material, in which a thin-film support is continuously led into a vacuum chamber from the atmospheric air, subjected to surface treatment and led-out to the atmospheric air again, comprising:

a leading-in and leading-out section having a leading-in portion and a leading-out portion;

at least one seal roller set formed by a leading-in roller, located in the leading-in portion of the leading-in and leading-out section, and a leading out roller located in the leading-out portion of the leading-in and leading-out section, wherein said leading out roller is adjacent said leading-in roller, and auxiliary rollers being positioned to set a lap angle of the support around said leading-in roller and said leading out roller of said at least one seal roller set in a range of from 30 to 150 degrees.

2. A sealing apparatus for vacuum treatment of a support for light-sensitive material of claim 1, further comprising:

a dust-proof/dust-removal means adjacent to the leading-in portion.

3. A sealing apparatus for vacuum treatment of a support for light-sensitive material of claim 2, further comprising:

an electric charge removing means provided adjacent said leading-out portion of said leading-in and leading-out section.

4. A sealing apparatus for vacuum treatment of a support for light-sensitive material of claim 3, wherein said electric charge removing means includes electrically conductive bars.

5. A sealing apparatus for vacuum treatment of a support for light-sensitive material of claim 1, wherein said at least one seal roller set is nearest to atmospheric air.

6. A sealing apparatus for vacuum treatment of a support for light-sensitive material of claim 1, wherein said at least one seal roller set comprises a plurality of seal roller sets, and wherein each of said seal roller sets includes a leading-in roller and a leading-out roller.

7. A sealing apparatus for vacuum treatment of a support for light-sensitive material of claim 1, wherein said leading-out roller is spaced from said leading-in roller by at least the thickness of the support plus 50 μm.

8. A sealing apparatus for vacuum treatment of a support for light-sensitive material of claim 1, wherein said leading-in roller is spaced from said leading-out roller by at least the thickness of the support plus 50 μm.

9. A sealing apparatus for vacuum treatment of a support for light-sensitive material of claim 1, wherein said leading-out roller is spaced from said auxiliary rollers by at least the thickness of the support plus 50 μm.

10. A sealing apparatus for vacuum treatment of a support for light-sensitive material of claim 1, wherein said leading-in roller is spaced from said auxiliary rollers by at least the thickness of the support plus 50 μm.

11. A sealing apparatus for vacuum treatment of a support for light sensitive material of claim 1, further comprising a space, around said leading-in roller, having a thickness substantially equal to the thickness of the support plus 50 μm, wherein there are no other rollers in said space.

12. A sealing apparatus for vacuum treatment of a support for light sensitive material of claim 1, wherein said auxiliary rollers are positioned to set the lap angle of the support around said leading-in roller and said leading-out roller in a range of from 50 to 120 degrees.

* * * * *